United States Patent [19]

Kohl et al.

[11] Patent Number: 4,977,340

[45] Date of Patent: Dec. 11, 1990

[54] DEVICE FOR PROTECTING AN ELECTRICAL CIRCUIT AGAINST INTERFERENCE PULSES

[75] Inventors: Walter Kohl, Bietigheim; Karl Nagel, Gomaringen, both of Fed. Rep. of Germany

[73] Assignee: Robert Bosch GmbH, Stuttgart, Fed. Rep. of Germany

[21] Appl. No.: 279,705

[22] PCT Filed: May 9, 1987

[86] PCT No.: PCT/DE87/00216
§ 371 Date: Nov. 23, 1988
§ 102(e) Date: Nov. 23, 1988

[87] PCT Pub. No.: WO87/07792
PCT Pub. Date: Dec. 17, 1987

[30] Foreign Application Priority Data

Jun. 6, 1986 [DE] Fed. Rep. of Germany ....... 3619098

[51] Int. Cl.$^5$ .............................................. H03K 5/00
[52] U.S. Cl. .................................. 307/520; 307/443; 307/544
[58] Field of Search ............... 307/520, 475, 443, 446, 307/455, 544, 355, 358, 363; 323/316

[56] References Cited

U.S. PATENT DOCUMENTS 3,760,196 9/1973 Nomoto et al. ..................... 307/544
4,287,435 9/1981 Cavaliere et al. ................... 307/455
4,289,978 9/1981 Konian et al. ....................... 307/455
4,339,669 7/1982 Jarrett et al. ......................... 307/475
4,518,878 5/1985 Moulding ............................. 307/520
4,890,015 12/1989 Wise ..................................... 307/443

FOREIGN PATENT DOCUMENTS 2734112 2/1979 Fed. Rep. of Germany ...... 307/520
2832766 2/1980 Fed. Rep. of Germany .

Primary Examiner—Stanley D. Miller
Assistant Examiner—T. Cunningham
Attorney, Agent, or Firm—Michael J. Striker

[57] ABSTRACT

A protection device for suppressing higher frequency interference pulses in an input signal for an electric circuit includes a transistor whose emitter is grounded via a current source to act as an emitter follower for an input signal. The voltage drop of the base-emitter diode of the transistor is compensated for by a corresponding voltage drop across a diode whose anode is connected to a voltage supply line via a second current source. A junction point of the second current source and the diode is connected to a capacitor which together with the second current source forms a low-pass member for the input signal. A Schmitt-trigger circuit is connected to the junction point to restore lower frequency input pulses from trapezoidal pulses picked up at the capacitor.

11 Claims, 2 Drawing Sheets

DEVICE FOR PROTECTING AN ELECTRICAL CIRCUIT AGAINST INTERFERENCE PULSES

BACKGROUND OF THE INVENTION

The present invention relates to a device for protecting input signals of an electrical circuit against interference pulses of a higher frequency.

Such a device is also known from the DE-PS No. 28 32 766. DE-OS No. 2832766 discloses a protection device comprising a capacitor which substantially determines the time constant of a low-pass filter which acts against higher-frequency interference signals or interference pulses. The low-pass filter substantially comprises a transistor which is switched via the capacitor into its conductive state when an interference pulse occurs and accordingly loads the source of interference at a low impedance. Low-frequency signals do not lead to an actuating of the transistor, so the overall arrangement acts like a low-pass filter.

A substantial disadvantage of this known protection device consists in that a very large capacitor is required, which does not readily permit a monolithic integration of the protection device, because the capacitors which can be realized in integrated circuits at a reasonable expense are in the order of magnitude of 100 pF. Moreover, currents can only be realized reasonably down to the order of magnitude of 0.5 uA. For even smaller currents, the limit is set by blocking currents, which sharply increase at high temperatures in particular. In practice, therefore a limit is set for the realization of integrated low-pass filters in monolithic integration technology. After this limit, one must work with a large capacitor which is to be connected from the outside to the remaining integrated portion of the protection device for reasons relating to costs and layout.

SUMMARY OF THE INVENTION

It is the object of the present invention to provide an electric circuit comprising a protection device for protection against interference signals, which protection device can be completely monolithically integrated at a reasonable expense and which, nevertheless, performs a high filtering action against interference signals.

This object is met by the provision of a protecting device which includes a power source, an emitter follower connected to the power source and including a transistor whose collector-emitter path is connected in series with a first current source and whose base is connected to a source of the input signals, a low-pass member including a series connection of a second current source and a capacitor, the series connection being connected to the power-source, and the junction point of the capacitor with the second current source being connected via a diode to the first current source and to the input of a Schmitt-trigger circuit. The output of the Schmitt-trigger is connected to an input of the electric circuit.

The electrical circuit according to the present invention has the particular advantage that it requires a particularly low expenditure on structural component elements. Accordingly, the integration is particularly inexpensive, since the integrated protection device requires very little surface area. Moreover, the protection device, according to the invention, has a particularly high resistance to temperature changes. The monolithic integration construction provides a virtually ideal synchronizing for the emitter follower and the diode, so that very few errors occur during the transmission of a constant-voltage level.

BRIEF DESCRIPTION OF THE DRAWING

The invention both as to its construction so to its method of operation, together with additional objects and advantages thereof, will be best understood from the following description of the preferred embodiments with reference to the accompanying drawings wherein.

DESCRIPTION OF THE PREFERRED EMBODIMENTS

Figure 1:
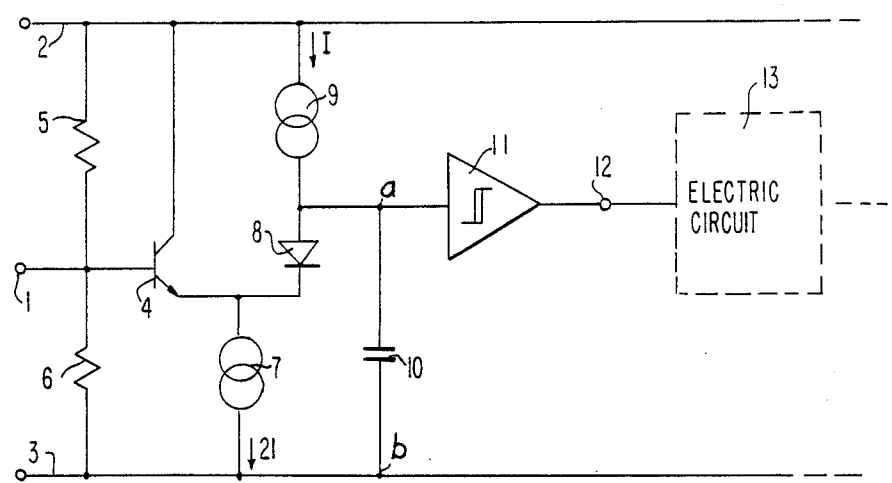
FIG. 1 shows a basic circuit diagram of a protection device, according to the invention, which is series connected with an input of a subsequent electric circuit arrangement.

FIG. 1 shows a basic circuit diagram of a protection device according to the invention with a signal input 1, which is operated between a supply voltage line 2 and a ground line 3. The signal to be applied to the input 1 leads to the base of a transistor 4 which is connected to act as an emitter follower. In addition, base a voltage divider consisting of two resistors 5, 6 is connected between the supply voltage line 2 and the ground line 3. The emitter of the transistor 4 leads to the ground line 3 via an emitter current source 7. In addition, it is connected with the cathode of a diode 8 whose anode leads to the supply voltage line 2 via a charging current source 9. A capacitor 10 is connected between the junction point a of the diode 8 and the charging current source 9, and the connection point b to the ground line 3. Further, the junction point is connected with the input of a Schmitt trigger 11, whose output is connected with the input 12 of an electric circuit arrangement 13, which is not shown in more detail for the sake of simplicity.

In the inactive state of the protection device, i.e. when there is no signal at the input 1, the potential at the base of the transistor 4 is determined by means of the divider ratio of the base voltage divider 5, 6 and the potential of the supply voltage line. Since the voltage drop across the base-emitter diode of the transistor 4 is compensated for by the same drop in voltage across the diode 8, the potential at the input of the Schmitt trigger 11 is substantially equal to the potential at the base of the transistor 4. The hysteresis characteristic line of the Schmitt trigger 11 is dimensioned in such a way that in the inactive state of the device there is an unequivocal potential at the input 12 which is approximately equal to the potential at the ground line.

During a sudden positive pulse-shaped signal at the input 1, the potential at the emitter of the transistor 4 connected as an emitter follower follows the step-shaped signal. Since the potential at the capacitor 10, and accordingly at the anode of the diode 8, has been determined by the previous potential, the diode 8 becomes blocked. The transistor 4 accordingly takes over the entire current of the emitter current source 7, while the entire current of the charging current source 9 is integrated by the capacitor 10. This process takes place until the voltage at the capacitor 10 matches the potential at the signal input 1.

On the other hand, during a sudden negative pulse-shaped signal at the input 1, the potential at the emitter of the transistor 4 remains intact, since it cannot drop below the voltage at the capacitor 10 which is reduced by the flow voltage drop of the diode 8. The transistor 4 forming the emitter follower is thus blocked. Current is then drawn off from the capacitor 10 by the current source 7 via the conductive diode 8 until the potential at the input of the Schmitt trigger 11 equals the potential at the signal input 1.

During a lower frequency rectangular signal at the input 1 of the protection device according to FIG. 1, a trapezoidal signal thus occurs at the input of the Schmitt trigger 11. The steepness of edges of the trapezoidal signal at the input of the Schmitt trigger 11 is dependent on the currents supplied by the emitter current source 7 and the charging current source 9 and on the magnitude of the capacitor 10. The trapezoidal voltage signal is exactly symmetrical when the current intensity of the current flowing through the emitter current source 7 is exactly twice the intensity I of the current flowing through the charging current source 9. The Schmitt trigger 11 responds to a trapezoidal input signal in a known manner in such a way that a rectangular signal, which is delayed relative to the input signal and is used for controlling the circuit arrangement 13, appears at its output.

Thus, the entire protection device acts like a low-pass filter which is connected prior to the input 12 of the circuit arrangement 13. Therefore, it offers a particularly good protection against pulse interference signals of higher frequency as they frequently occur during operation in a motor vehicle. Therefore, the protection device, according to the invention, is applied chiefly in integrated controlling means for rotary current generators aboard a motor vehicle. However, the protection device, according to the invention, is usable in a universal manner and is suitable both for analog and digital signals.

Figure 2:
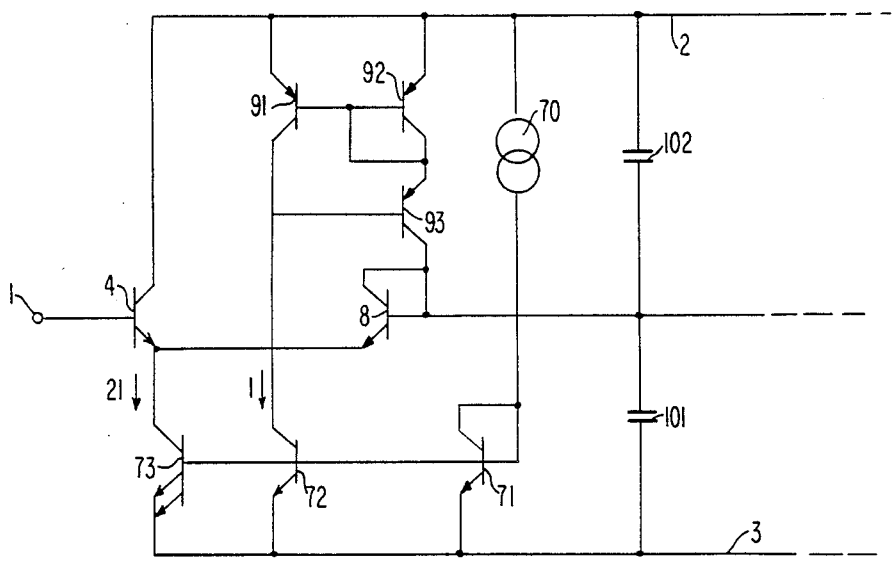
FIG. 2 shows a particularly simple embodiment of a protection device according to the invention which is suitable for a completely monolithic integration.

A simplified form of the circuit arrangement according to the basic circuit diagram shown in FIG. 1, which is suitable particularly for a monolithic integration, is shown in FIG. 2. For the sake of simplicity, no base voltage divider, no Schmitt trigger, and no circuit arrangement, is shown.

The protection device shown in FIG. 2 comprises a signal input 1 and is operated between a supply voltage line 2 and a ground line 3. As in FIG. 1, the input signal leads to the base of a transistor 4 which acts as an emitter follower. The diode 8 is realized by means of a transistor whose collector and base are short circuited with one another in order to form the anode of the diode 8. The capacitor 10 is now formed by a capacitor 101, which is connected with the ground line 3, and by a capacitor 102 which is connected with the supply voltage line 2. The total capacitance is thus represented by the sum of capacitances of the capacitors 101, 102.

The emitter current source 7 and the charging current source 9, of FIG. 1, are now dependent on a single current source 70 in the protection device shown in FIG. 2. The current source 70 is formed in the simplest embodiment form by a single ohmic resistor. It supplies current from the supply voltage line 2 via a transistor 71 to the ground line 3, the transistor 71 being connected as an input diode of a current mirror arrangement. The current mirror arrangement comprises two output transistors 72, 73. The current flowing through the collector of the output transistor 72 serves to control the charging current source. The current flowing through the collector of the output transistor 73 is the current of the emitter current source, for which purpose the collector of the output transistor 73 is connected with the emitter of the emitter follower 4. The emitter surfaces of the transistors 71, 72, 73 are dimensioned in such a way that the output current through the transistor 73 is twice as great as the output current through the transistor 72.

The charging current source 9 of FIG. 1 is formed, in a known manner, by a current source with three transistors 91, 92, 93. As already mentioned, the control current of this current source is provided by the output transistor 72. The emitters of the transistors 91, 92 are connected with the supply voltage line 2. The collector of the transistor 91 is connected with the collector of the transistor 72 and the base of the transistor 93. The emitter of the transistor 93 is connected with the collector of the transistor 92 and the bases of the transistors 91, 92. The collector of the transistor 93 again leads to the anode of the diode 8.

The operation of the circuit shown in FIG. 2 corresponds to that of the basic circuit shown in FIG. 1, and a repeated description is dispensed with here for the sake of simplicity.

The capacitor 10 and the capacitors 101, 102, respectively, can be realized in desired variants in integrated technology, e.g. in MOS technology or as barrier layer capacitors. When realized the capacitors as barrier layer capacitors, the use of two capacitors, according to the arrangement according to FIG. 2, is particularly advantageous, since a barrier layer capacitors are dependent on the applied voltage. This effect is compensated for by a parallel connection of the two capacitors 101, 102. The compensation of the reciprocal blocking currents is likewise particularly advantageous. In addition, interference in the supply voltage line 2 caused by the capacitive voltage division at the input of the Schmitt trigger 11 shown in FIG. 1, is only effective to a reduced extent.

Figure 3:
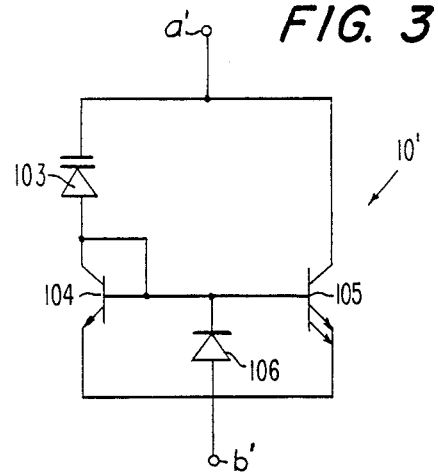
FIG. 3 shows a modification of the capacitive means of FIG. 1 for increasing the capacitor effect of an integrated barrier layer capacitor.

An arrangement for increasing the capacitor action of a barrier layer capacitor is shown in FIG. 3. For this purpose, the barrier layer capacitor is formed as a capacitor diode 103 which is operated in the blocking voltage direction and is connected in series to the emitter-collector junction of a transistor acting as an input diode 104 of a current mirror arrangement 104, 105. The current ratio of the current mirror arrangement 104, 105 is adjusted by the emitter surfaces. If the ratio of the surface of the emitter of the input diode 104 to the surface of the emitter of the transistor 105 is selected so as to equal 1/n, the two-terminal network shown in FIG. 3 appears as a barrier layer capacitor 101 with a magnitude which is n+1 times that of the barrier layer capacitor 103 because of the charging current amplification. The terminals a', b' are connected to points a, b in FIG. 1.

In order to discharge the barrier layer capacitor 103, a diode 106 is provided which is connected to extend transverse to the base-emitter diodes of the current mirror circuit 104, 105. Naturally, the barrier layer capacitor 103 does not appear amplified by the factor n+1. In monolithic integration of current mirror-arrangement with n-p-n transistors, the diode 106 can be formed by the collector-substrate diode of the input diode 104.

These response thresholds of the capacitor amplification, which are caused by the base-emitter voltages of the current mirror arrangement or of the diode, can lead to an undesirable falsification of the output signal when using the protection device for analog signals. An embodiment of the invention which does not have these disadvantageous response thresholds of the capacitor amplification is shown in FIG. 4.

Figure 4:
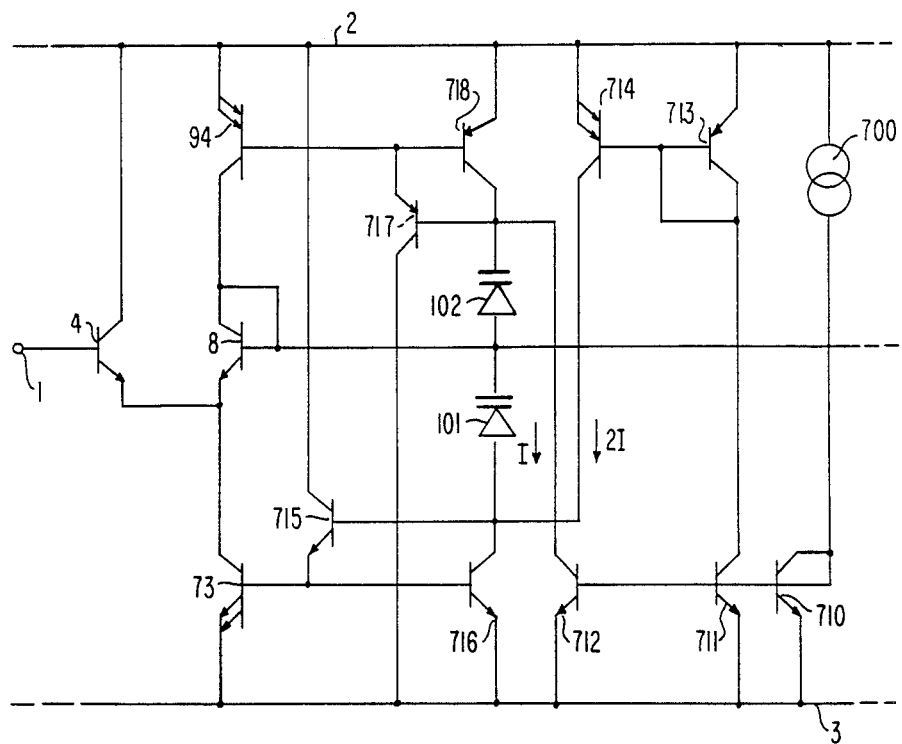
FIG. 4 shows an embodiment of a protection device according to the invention with a particularly high capacitor effect.

The protection device shown in FIG. 4 is provided with a signal input 1, as in the previous FIGS. 1 and 2, and is operated between a supply voltage line 2 and a ground line 3. The input signal is fed to an emitter follower 4, in a manner already described, whose emitter is connected with the cathode of a diode 8. The anode of the diode 8 leads to two barrier layer capacitors 101, 102 corresponding to the drawing shown in FIG. 2.

The barrier layer capacitor 101 leads from the anode of the diode 8 to the ground line 3 via the collector-emitter junction of a transistor 716. The base of the transistor 716 is connected with the base of a transistor 73 whose collector-emitter junction leads from the emitter of the emitter follower 4 to the ground line 3. The collector of the transistor 716 is connected with the base of the transistor 73 via the base-emitter diode of a transistor 715. The collector of the transistor 715, on the other hand, is connected to the distribution voltage line 2. The transistors 716, 73 thus form a current mirror, arrangement wherein the transistor 715 serves in a known manner as a base current amplifier in order to achieve an improved synchronization characteristic between the transistors 716, 73. The barrier layer capacitor 101 is connected in the input current path of the current mirror 716, 73, while the output current path is connected with the emitter follower 4 and the diode 8, respectively.

The barrier layer capacitor 102 is operated in a manner which is completely symmetrical to the latter, the depletion-layer capacitor 102 being connected with the supply voltage line 2 via the collector-emitter junction of a transistor 718. A transistor 717, whose base-emitter diode is connected parallel to the collector-base junction of the transistor 718 and whose collector leads to the ground line 3, serves as a current amplifier. A current mirror arrangement 718, 94, whose output current path is connected with the anode of the diode 8, is formed by a transistor 94.

A comparison of the drawings shown in FIGS. 4 and 1 clearly shows that the transistor 94 in FIG. 4 corresponds to the charging current source 9 in FIG. 1, while the transistor 73 in FIG. 4 corresponds to the emitter current source 7 in FIG. 1. In addition, it is stated above in the description of FIG. 1 that a particularly symmetrical operating behavior of the protection device, according to the invention, is achieved in that the intensity of the current supplied by the emitter current source 7 is approximately twice as great as the current intensity of the current supplied by the charging current source 9. This behavior is also adjusted in the protection device shown in FIG. 4 in that the transistor 718 is acted upon with a constant current I, whereas the transistor 716 is acted upon with an additional constant current 2I having twice the intensity of the first constant current I. These two constant currents I, 2I are generated in a known manner by cascading a plurality of current mirrors arrangement from a single current source 700. The current source 700 can be realized in the simplest embodiment form by a single ohmic resistor. For this purpose, the current of the current source 700 flows from the supply voltage line 2 to the ground line 3 via a transistor which is connected as input diode 710 of a current mirror arrangement. The current mirror arrangement comprises two output transistors 711, 712, whose emitters are connected with the ground line 3, in each instance. The collector of the output transistor 712 is connected with the base of the base current amplifier 717. The collector of the output transistor 711 leads to a current mirror arrangement 713, 714 which is operated by the distribution voltage line 2, wherein the transistor 713 is operated as an input diode from the collector current of the transistor 711. The collector of the output transistor 714 leads to the base current amplifier 715. The emitter surfaces of the current mirror arrangement 713, 714 and of the current mirror arrangement 710, 711, 712 are adjusted in such a way that the output current 2I of the transistor 714 is exactly twice as strong as the output current I of the transistor 712.

In the drawing shown in FIG. 4, the capacitors appear amplified in each instance by the translation ratio of the current mirror arrangment 718, 94 and 716, 73, respectively. Current flows continuously through the arrangement shown in FIG. 4. Changes in potential at the anode of the diode 8 lead directly to an additional triggering of the current mirror arrangement via the charged barrier layer capacitors 101, 102. Since this occurs at a circuit intersection by current addition during increase in potential as well as during a drop in potential at the anode of the diode 8, the arrangement in FIG. 4 does not have the disadvantageous response thresholds for the capacitor amplification described with reference to FIG. 3.

We claim:

1. A device for protecting input signals of an electric circuit against interference pulses of a higher frequency, comprising
   a power source having a first terminal and a second terminal;
   an emitter follower including a transistor having its base connected to a source of the input signals, and a first series connection of the collector-emitter path of said transistor with a first current source;
   said first series connection being connected between said first and second terminals;
   a low-pass member including a second series connection of a second current source and a capacitor means; said second series connection being coupled between said first and second terminals;
   a compensating diode having its anode connected to junction point of the second current source with the capacitor means and its cathode connected to a junction point of the first current source with the emitter of the transistor; and
   means for applying a signal present at said capacitor means to an input of the electrical circuit.

2. A device according to claim 1 wherein said first and second current sources are formed as current mirror circuits.

3. A device according to claim 2 wherein said current mirror circuits comprise a first current mirror circuit having a first input diode connected in series with a constant current source, a first output transistor forming said first current source, and a first control transistor; said series connection of the constant current source and the first input diode being connected between said first and second power source terminals; a second current mirror circuit having a series connection of a second input diode and a second output transistor, and a second control transistor, the series connection of the second input diode and the second output transistor being connected between the first power source terminal and said compensating diode; a collector of said second control transistor being connected to the base of said second output transistor and to the collector of said first control transistor; the base of said first control transistor being connected to a node between said constant current source and said first input diode; and emitters of said first- and second control transistors being connected to said second first and first power source terminals, respectively.

4. A device according to claim 3 wherein said first current source supplies a first constant current having a first intensity value and said second current source supplies a second constant current having a second intensity value, the first intensity value being approximately two times higher than the second intensity value.

5. A device according to claim 3, wherein said capacitor means comprises a first capacitor connected between said anode of the compensating diode and one of said power source terminals, and wherein the device further comprises a second capacitor connected between said anode of the compensating diode and an other of the power source terminals.

6. A device according to claim 1, said second series connection further comprising means for amplifying charging and discharging current through said capacitor means.

7. A device according to claim 6 wherein said capacitor means is a capacitor diode; said amplifying means including an input diode of a current mirror connected in series with said capacitor diode; said current mirror including an amplifying transistor whose base is connected to the junction point of said capacitor diode and said input diode and whose collector-emitter path is connected parallel to said series connection of the capacitor diode and the input diode.

8. A device as defined in claim 7 further comprising a discharging diode connected antiparallel to said input diode.

9. A device according to claim 1 wherein said compensating diode comprises a base-emitter diode of a transistor.

10. A device according to claim 1, wherein the second current source is a resistor.

11. A device according to claim 1 wherein the applying means comprises a Schmitt-trigger circuit having an input connected to the junction point of the second current source and the capacitor means, and an output connected to the input of the electrical circuit.

* * * * *